US005853284A

United States Patent [19]
Ohzeki et al.

[11] Patent Number: 5,853,284
[45] Date of Patent: Dec. 29, 1998

[54] NOTCHED WAFER ALIGNING APPARATUS

[75] Inventors: Ryo Ohzeki, Saitama; Tadayasu Ohsawa, Tokyo, both of Japan

[73] Assignee: Kaijo Corporation, Japan

[21] Appl. No.: 926,607

[22] Filed: Sep. 10, 1997

[30] Foreign Application Priority Data

Sep. 24, 1996 [JP] Japan .................................. 8-271328

[51] Int. Cl.$^6$ ................................................. B65G 47/24
[52] U.S. Cl. ............................ 414/757; 198/394; 414/936
[58] Field of Search ............................ 198/394; 414/757, 414/936, 938

[56] References Cited

U.S. PATENT DOCUMENTS

| | | | |
|---|---|---|---|
| 5,028,200 | 7/1991 | Shimane | 414/757 |
| 5,155,888 | 10/1992 | Lau | 29/25.01 |
| 5,183,378 | 2/1993 | Asano et al. | 414/757 |
| 5,533,243 | 7/1996 | Asano | 29/25.01 |
| 5,662,452 | 9/1997 | Allison | 414/936 X |

FOREIGN PATENT DOCUMENTS

| | | |
|---|---|---|
| 0 376 160 A2 | 7/1990 | European Pat. Off. . |
| 5-259264 | 10/1993 | Japan ........................... 414/936 |

OTHER PUBLICATIONS

Recif Inc., "Recif Experience on 8 Projects," brochure, Recif Inc., San Jose, CA; date unknown.

MGI Electronices, "Model #VXM–0495 200 mm Notch Aligner," brochure; date unknown.

Mactronix, "Mactronix, NFM–800 Manual Notch Aligner," leaflet, Japan; date unknown.

Mactronix, "Mactronix, NFA–800 Automatic Notch Aligner," leaflet, Japan; date unknown.

Primary Examiner—Janice L. Krizek
Attorney, Agent, or Firm—Lerner, David, Littenberg, Krumholz & Mentlik

[57] ABSTRACT

A notched wafer aligning apparatus capable of aligning a number of notched wafers received in a cassette with each other at a predetermined position and facilitating shifting of the thus-aligned wafers to any desired position. A plurality of notch detection rollers are rotatably arranged in juxtaposition to each other on a rotation drive shaft so as to be rotated while being abutted against a lower portion of peripheral edges of the wafers through a lower open end of the cassette. The notch detection rollers are individually rotated due to friction between the notch detection rollers and the rotation drive shaft.

33 Claims, 8 Drawing Sheets

NOTCHED WAFER ALIGNING APPARATUS

BACKGROUND OF THE INVENTION

This invention relates to a notched wafer aligning apparatus, and more particularly to a notched wafer aligning apparatus for aligning notched wafers each provided on an outer periphery with a notch such as a cutout, a depression or the like in the same direction while orientating them in a predetermined direction by means of the notch of each of the notched wafers.

Handling or processing of semiconductor wafers is typically carried out while receiving the wafers in a cassette acting as a carrier or the like. In such an instance, it is required to align the wafers at the same position and/or in the same direction in order to ensure that the wafers fall within desired specifications therefor. Aligning of wafers is conventionally carried out by positioning the wafers using orientation flat (OF) alignment techniques or V-notch alignment techniques. The V-notch alignment is adapted to orientate wafers in the same direction by means of a V-notch formed on an outer periphery of each of the wafers. The OF alignment tends to cause deviation or displacement of a plurality of such wafers received in a cassette. Thus, the V-notch alignment permits the wafers to be accurately aligned with each other at a preset position as compared with the OF alignment. Also, the V-notch alignment facilitates wafer aligning operation as compared with the OF alignment.

Nevertheless, even when aligning of notches of a plurality of wafers by the conventional V-notch alignment is carried out by means of an aligning pin mounted on a mounting unit, it is substantially troublesome to ensure that a dimension of the notches and a tolerance thereof fall within desired specifications therefor. Also, the conventional V-notch alignment causes misalignment or deviation of the notches with a fine error, to thereby fail to align the wafers with each other with highly increased accuracy. In addition, an outer periphery of each of the wafers and an interior of the cassette are each provided thereon with a slide portion, so that generated particles and static electricity may be possibly increased. This causes fine adjustment in positioning of the notched wafers based on specifications therefor and shifting of the wafers to any desired position to be substantially difficult, resulting in wafer aligning operation being highly troublesome.

SUMMARY OF THE INVENTION

The present invention has been made in view of the foregoing disadvantages of the prior art.

Accordingly, it is an object of the present invention to provide a notched wafer aligning apparatus which is capable of accurately aligning notched wafers which are received in disorder in a cassette with each other at a predetermined position and accurately shifting them to any desired position.

It is another object of the present invention to provide a notched wafer aligning apparatus which is capable of minimizing or substantially preventing generation of particles and static electricity in a cassette in which notched wafers are received.

It is a further object of the present invention to provide a notched wafer aligning apparatus which is capable of accurately aligning notched wafers with each other with increased reliability while minimizing generation of an error in positional alignment of the wafers during wafer aligning operation.

It is still another object of the present invention to provide a notched wafer aligning apparatus which is capable of substantially improving notched wafer aligning operation while minimizing a necessity of adjustment for the aligning.

It is yet another object of the present invention to provide a notched wafer aligning apparatus which is capable of being significantly simplified in structure.

It is still another object of the present invention to provide a notched wafer aligning apparatus which is capable of being reduced in cost while exhibiting improved workability.

In accordance with the present invention, a notched wafer aligning apparatus for aligning a plurality of notched wafers arranged in juxtaposition to each other in a cassette with each other is provided. The notched wafer aligning apparatus includes a plurality of notch detection rollers rotatably arranged so as to be rotationally driven while being respectively abutted against peripheral edges of the notched wafers to orientate notches of the wafers in the same direction. The notch detection rollers are rotatably mounted on a rotation drive shaft in juxtaposition to each other while being arranged in correspondence to the notched wafers and at a position deviated by a predetermined distance from a vertical center line of the notched wafers. The notch detection rollers are individually rotated on the rotation drive shaft by frictional force between the notch detection rollers and the rotation drive shaft to move the notched wafers in the cassette, to thereby orientate the notched wafers in the same direction.

In a preferred embodiment of the present invention, the rotation drive shaft for the notch detection rollers is supported on a vertically movable mounting base. The mounting base is mounted thereon with a first drive motor which is operatively connected to the rotation drive shaft. The mounting base is mounted to a first lifting mechanism so as to be vertically moved by the first lifting mechanism, whereby the notch detection rollers are brought into and out of contact with the peripheral edges of the notched wafers while being vertically moved through the mounting base. The first lifting mechanism may include a first cylinder and the first drive motor is operatively connected to the rotation drive shaft through a first wrapping transmission mechanism. The first wrapping transmission mechanism includes a first pulley mounted on the rotation drive shaft and a first belt operatively connected between the first drive motor and the first pulley.

In a preferred embodiment of the present invention, the notched wafer aligning apparatus further includes guide rollers arranged at a position spaced by a predetermined distance from the notch detection rollers in a direction of rotation of the notched wafers rotated by the notch detection rollers to guide rotation of the notched wafers while being engaged with the respective peripheral edges of the notched wafers. The guide rollers may each be rotatably mounted on a fixed support shaft so as to individually follow rotation of the rotated wafers. The support shaft for the guide rollers may be supported on the mounting base so that the guide rollers are brought into and out of contact with the peripheral edges of the notched wafers while being vertically moved through the mounting base.

In a preferred embodiment of the present invention, the notched wafer aligning apparatus further includes an additional alignment roller vertically movably arranged for separating and transferring, from the notch detection rollers, the notched wafers aligned with each other by the notch detection rollers.

In a preferred embodiment of the present invention, the additional alignment roller is rotationally driven by a second drive motor through a second wrapping transmission mechanism including a second pulley mounted on the additional alignment roller and a second belt operatively connected between the second drive motor and the second pulley. The additional alignment roller is vertically moved through a second lift mechanism including a second cylinder, resulting in the additional alignment roller being lifted to separate the notched wafers aligned by the notch detection rollers from the notch detection rollers and rotated to transfer the notched wafers to a predetermined position.

In a preferred embodiment of the present invention, the notch detection rollers are fitted on the rotation drive shaft at intervals and a first retaining ring is interposed between each adjacent two of the notch detection rollers. The first retaining rings are respectively fitted in annular grooves formed on the rotation drive shaft.

In a preferred embodiment of the present invention, the notch detection rollers are fitted on the rotation drive shaft through respective first single-flanged collars securely fitted on the rotation drive shaft.

In a preferred embodiment of the present invention, the notch detection rollers are each formed on an inner peripheral surface thereof with an annular projection and the rotation drive shaft is formed thereon with annular grooves in each of which the annular projection of a corresponding one of the notch detection rollers is received. The notch detection rollers are arranged on the rotation drive shaft so that a gap is defined between each adjacent two of the notch detection rollers.

In a preferred embodiment of the present invention, the guide rollers are fitted on the support shaft at intervals and a second retaining ring is interposed between each adjacent two of the guide rollers. The second retaining rings are respectively fitted in annular grooves formed on the support shaft.

In a preferred embodiment of the present invention, the guide rollers are fitted on the support shaft through respective second single-flanged collars securely fitted on the support shaft.

In a preferred embodiment of the present invention, the guide rollers are each formed on an inner peripheral surface thereof with an annular projection and the support shaft is formed thereon with annular grooves in each of which the annular projection of a corresponding one of the guide rollers is received. The guide rollers are arranged on the support shaft so that a gap is defined between each adjacent two of the guide rollers.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIGS. 9A to 9C each are a schematic view showing sliding of the notch detection rollers and guide rollers, wherein FIG. 9A shows a normal state in which all the notch detection rollers are driven to rotate the notched wafers, FIG. 9B shows a state in which only a part of the notch detection rollers are driven to rotate the notched wafers and FIG. 9C shows a state in which pressing force is applied to all the notch detection rollers to stop rotation of the notch detection rollers;

DETAILED DESCRIPTION OF THE PREFERRED EMBODIMENTS

Figure 1:
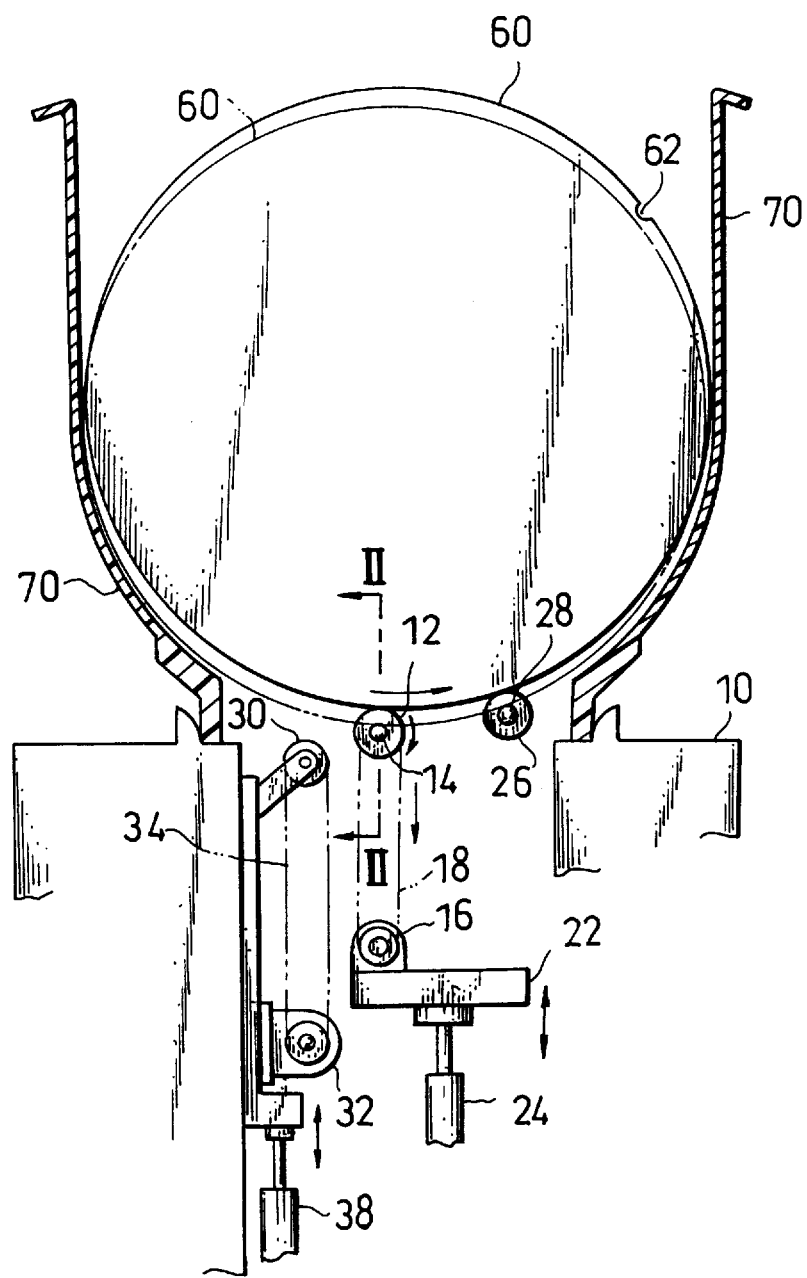
FIG. 1 is a front elevation view partly in section schematically showing an essential part of a first embodiment of a notched wafer aligning apparatus according to the present invention.

Now, a notched wafer aligning apparatus according to the present invention will be described hereinafter with reference to the accompanying drawings.

Referring first to FIGS. 1 to 7, a first embodiment of a notched wafer aligning apparatus according to the present invention is illustrated. A notched wafer aligning apparatus of the illustrated embodiment includes a base 10 on which a cassette 70 for receiving a plurality of notched wafers 60 therein is placed. The notched wafers 60 are each formed with a notch 62. The notched wafer aligning apparatus of the illustrated embodiment also includes a plurality of notch detection rollers 12 arranged in a manner to be rotatable. The notch detection rollers 12 are each constructed so as to be rotationally driven while being abutted against a lower portion of a peripheral edge of a corresponding one of the notched wafers 60, to thereby orientate the notches 62 of the wafers 60 in a predetermined identical direction. The notch detection rollers 12 are arranged on a rotation drive shaft 14 in a manner to be juxtaposed to each other and so as to be rotatable on the rotation drive shaft 14 independently from the rotation drive shaft 14. Also, the notch detection rollers 12 are arranged in a manner to positionally correspond to the notched wafers 60 received in the cassette 70, respectively. Further, the notch detection rollers 12 are disposed at a position deviated by a distance f from a vertical center line of the notched wafers 60. The distance f may be set to be, for example, about 3 to 20 mm, and more preferably about 4 to 8 mm. The notch detection rollers 12 are adapted to be individually driven by frictional force between the notch detection rollers 12 and the rotation drive shaft 14 to orientate the notched wafers 60 in the same direction while moving them in the cassette 70. The notched wafer aligning apparatus of the illustrated embodiment may be located at an automated intake section of a wet station (not shown) for cleaning and drying the wafers 60 or an automated takeout section thereof.

Figure 2:
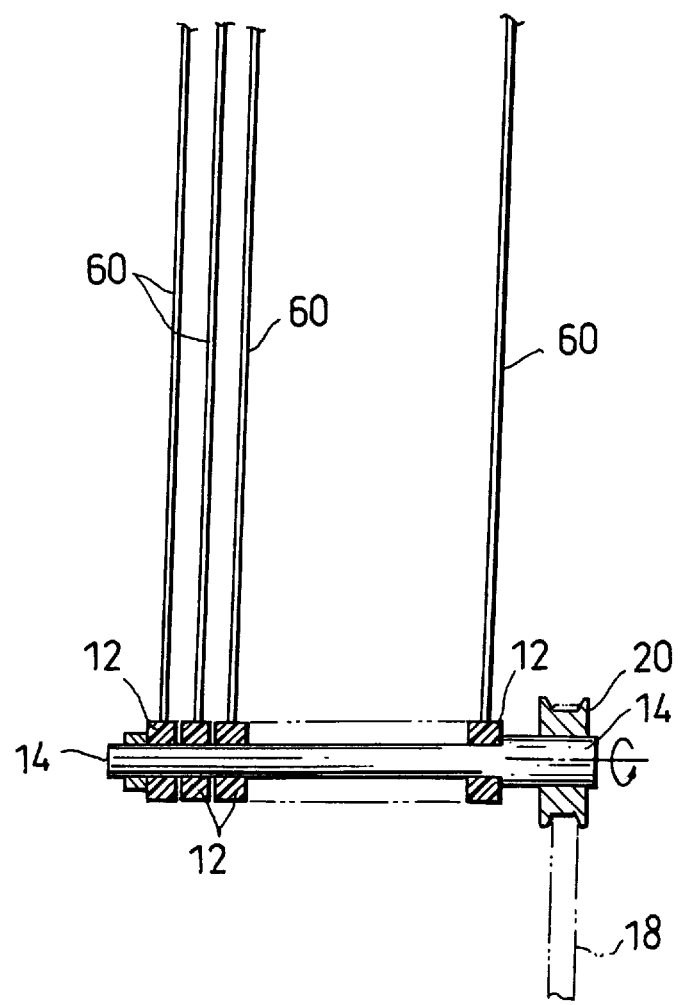
FIG. 2 is an enlarged vertical sectional view taken along line II—II of FIG. 1.

The notch detection rollers 12 may be made of a synthetic resin material exhibiting increased mechanical strength, weatherability, chemical resistance and mass productivity such as, for example, CTFE, PEEK, PVC, PC or the like. In the illustrated embodiment, the notch detection rollers 12 are desirably disposed at a position deviated by about 5 mm from the vertical center line of the notched wafers 60 received in the cassette 70. In other words, the notch detection rollers 12 are each preferably arranged at a position which permits each of the notch detection rollers 12 to substantially bear a weight of a corresponding one of the notched wafers 60 and be deviated from each of the notched wafers 60 in a predetermined identical direction. The rotation drive shaft 14 has turning force applied thereto from a first drive motor 16 through a first wrapping transmission mechanism including a first belt 18 operatively connected to the first drive motor 16 and a first pulley 20 which is mounted on the rotation drive shaft 14 and through which the first belt 18 is arranged so as to pass. Thus, the first belt 18 is operatively connected between the first drive motor 16 and the first pulley 20. The rotation drive shaft 14 has twenty-five to twenty-six such notch detection rollers 12 for individually or respectively rotating twenty-five to twenty-six such notched wafers 60 fitted thereon in a manner not to be fixed with respect to the rotation drive shaft 14, as shown in FIGS. 1 and 2.

The rotation drive shaft 14 is supported on a mounting base 22 arranged in a vertically movable manner and is rotated through the first belt 18 and first pulley 20 by means of the first drive motor 16. In the illustrated embodiment, the first drive motor 16 is mounted on the mounting base 22. The mounting base 22 is mounted to a first cylinder 24 for vertically moving the mounting base 22, so that the notch detection rollers 12 may be vertically moved so as to be selectively brought into contact with the notched wafers 60. The notch detection rollers 12, as described above, are disposed at a position deviated by a distance f of, for example, about 5 mm from the vertical center line of the notched wafers 60 received in the cassette 70.

Also, the notched wafer aligning apparatus of the illustrated embodiment includes guide rollers 26 arranged on the vertically movable mounting base 22 in a manner to be juxtaposed to the notch detection rollers 12 and at a position spaced by a predetermined distance s such as, for example, about 40 mm from the notch detection rollers 12 in a direction of rotation of the notched wafers 60 rotated by the notch detection rollers 12 to guide rotation of the notched wafers 60 while bearing the peripheral edges of the notched wafers 60. In addition, the notched wafer aligning apparatus of the illustrated embodiment includes an additional alignment roller or top alignment roller 30 vertically movably arranged for separating and transferring the notched wafers 60 from the notch detection rollers 12 and guide rollers 26, after the notched wafers 60 are aligned with each other through the notches 62 of the wafers 60 by rotation of the notch detection rollers 12.

Figure 3:
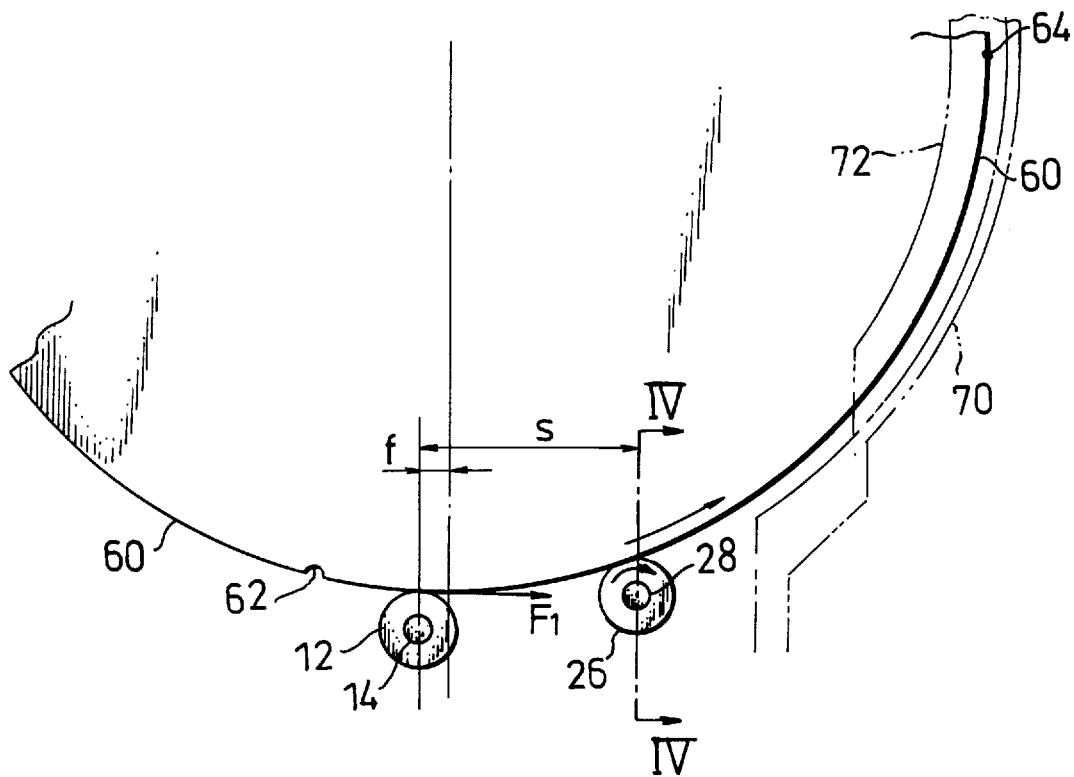
FIG. 3 is a fragmentary enlarged front elevation view showing a part of the notched wafer aligning apparatus of FIG. 1.
Figure 4:
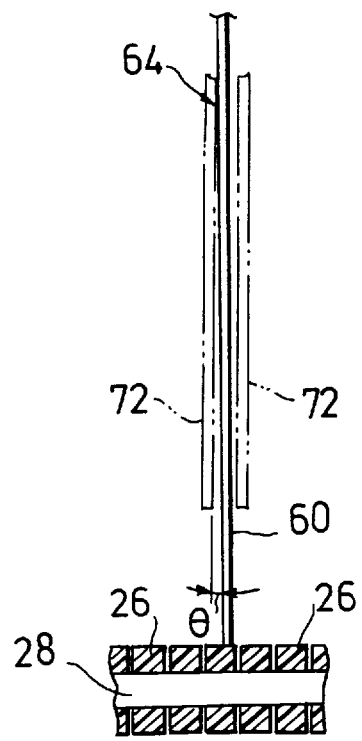
FIG. 4 is a sectional view taken along line IV—IV of FIG. 3.

The guide rollers 26 may be made of a synthetic resin material exhibiting increased mechanical strength, weatherability, chemical resistance and mass productivity such as, for example, CTFE, PEEK, PVC, PC or the like. The guide rollers 26 function to guide rotation of the notched wafers 60 which are being rotated in the cassette 70 by the notch detection rollers 12. For this purpose, the guide rollers 26 may be arranged in a manner to be spaced from the notch detection rollers 12 while being opposite to the notch detection rollers 12 with the vertical center line of the notched wafers 60 being interposed between the guide rollers 26 and the notch detection rollers 12. Thus, the guide rollers 26 are mounted on a fixed support shaft 28 so as to be rotatable with respect to the fixed support shaft 28, to thereby receive and follow rotation of the notched wafers 60 in the cassette 70, resulting in the guide rollers 26 individually guiding rotation of the notched wafers 60. The guide rollers 26 are arranged in juxtaposition to the notch detection rollers 12. Thus, twenty-five to twenty-six such guide rollers 26 are arranged in juxtaposition to each other and in a manner to be rotatable on the fixed support shaft 28 independent from the fixed support shaft 28, to thereby individually guide twenty-five to twenty-six notched wafers 60, as shown in FIGS. 3 and 4.

The guide rollers 26, as described above, may be likewise mounted on the mounting base 22 on which the notch detection rollers 12 are mounted, resulting in being brought into contact with a lower portion of the peripheral edges of the notched wafers 60 when the notch detection rollers 12 are brought into contact with the lower portion of the peripheral edges of the notched wafers 60 due to vertical movement of the mounting base 22.

Figure 6:
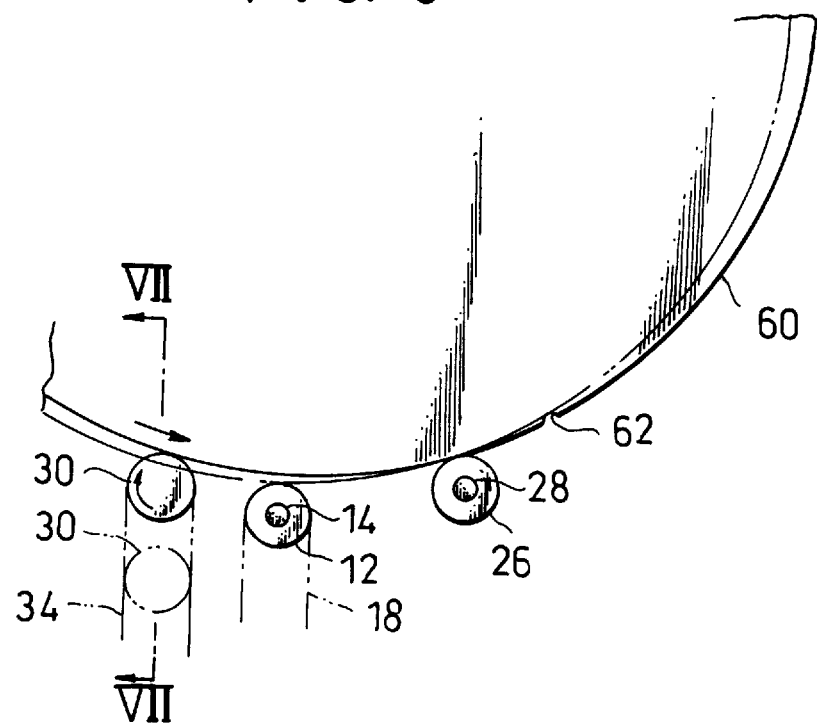
FIG. 6 is a fragmentary enlarged front elevation view showing a top wafer aligning mechanism incorporated in the notched wafer aligning apparatus shown in FIG. 1.
Figure 7:
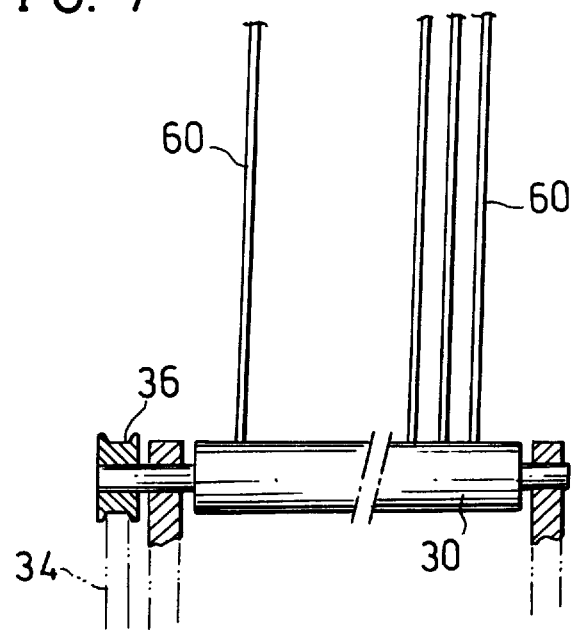
FIG. 7 is a vertical sectional view taken along line VII—VII of FIG. 6.

The top alignment roller 30 is rotationally driven by a second drive motor 32 through a second wrapping transmission mechanism including a second belt 34 and a second pulley 36 operatively connected to the second drive motor 32 and is vertically moved through a lift mechanism including a second cylinder 38. The top alignment roller 30 thus constructed is lifted through the lift mechanism, to thereby permit the notched wafers 60 aligned with each other through the notches 62 by the notch detection rollers 12 to be separated from the notch detection rollers 12 and then the notches 62 of the notched wafers 60 to be transferred to a predetermined position while being rotated, as shown in FIG. 6.

The top alignment roller 30 stands by at a lower position during a period of time for which the notched wafers 60 in the cassette 70 are subjected to notch alignment or bottom notch alignment by means of the notch detection rollers 12 and guide rollers 26. When the bottom notch alignment is completed, the top alignment roller 30 is upwardly moved to lift the notched wafers 60 in the cassette 70 to a position which permits the wafers 60 to be separated from the notch detection rollers 12, resulting in a gap being defined between the wafers 60 and the notch detection rollers 12. Then, the top alignment roller 30 upwardly transfers or moves the notches 62 of the notched wafers 60 due to rotation thereof. The top alignment roller 30 may be constituted by a cylindrical member coated or lined on an outer surface thereof with silicone rubber or the like and is connected at one end thereof to the second pulley 36, which is operatively connected through the second belt 34 to the second drive motor 32, resulting in drive force of the second drive motor 32 being transmitted in the form of turning force to the top alignment roller 30.

Upward movement of the notch detection rollers 12 from below the cassette 70 in which the notched wafers 60 are received is stopped at an upper end of a vertical stroke thereof after it raises up the wafers 60 in the cassette 70. The rotation drive shaft 14 is rotated by drive force transmitted from the first drive motor 16 through the first belt 18 and first pulley 20 thereto. This results in the notch detection rollers 12 being individually rotated due to frictional force between the rotation drive shaft 14 and the notch detection rollers 12 in synchronism with rotation of the rotation drive shaft 14 while carrying the notched wafers 60 on the notch detection rollers 12, because the notch detection rollers 12 fitted on the rotation drive shaft 14 are individually arranged in correspondence to the twenty-five to twenty-six individual notched wafers 60 received in the cassette 70 without being fixed on the rotation drive shaft 14.

Thus, rotation of the notch detection rollers 12 is carried out due to friction between the notch detection rollers 12 and the rotation drive shaft 14. In this instance, when materials for the notch detection rollers 12 and rotation drive shaft 14 are suitably selected to obtain a sliding friction coefficient of, for example, 0.3 therebetween, maximum drive force $F_1$ on an outer peripheral surface of each of the notch detection rollers 12 due to maximum static friction generated between the notch detection rollers 12 and the rotation drive shaft 14 is calculated to be 9.6 gf according to the following expression (1):

$$F_1 = (d_1/D_1) \times W \mu_1 \qquad (1)$$

wherein $D_1$ indicates an outer diameter of the notch detection rollers 12, $d_1$ is an outer diameter of the rotation drive shaft 14, W is a load or weight of the wafer 60 and $\mu_1$ is a friction coefficient. Set $D_1$=15 mm, $d_1$=6 mm, W=80 gf, $\mu_1$=0.3: then $$F_1 = (6/15) \times 80 \times 0.3 = 9.6 \text{ (gf)}$$

While the notch detection rollers 12 are abutted against the lower portion of the peripheral edges of the notched wafers 60 to rotate the wafers 60, the guide rollers 26 are likewise kept in contact with the lower portion of the peripheral edges of the wafers 60. Thus, when the guide rollers 26 guide rotation of the wafers 60, the guide rollers 26 each generate resistive force $F_2$ calculated by the following expression (2) with respect to the notched wafer 60:

$$F_2 = W \times (f/s) \times (d_2/D_2) \times \mu_2 \qquad (2)$$

wherein W is a load or weight of the wafer 60, f is a deviation of the notch detection rollers 12 from the vertical center line of the wafers 60, s is a horizontal distance between the notch detection rollers 12 and the guide rollers 26, $D_2$ is an outer diameter of the guide rollers 26, $d_2$ is an outer diameter of the support shaft 28 and $\mu_2$ is a friction coefficient between the guide rollers 26 and the support shaft 28, which is supposed to be 0.1. Set f=5 mm, s=40 mm, $D_2$=16 mm, $d_2$=6 mm, W=80 gf, $\mu_2$=0.1: then $$F_2 = 80 \times (5/40) \times (6/16) \times 0.1 = 0.38 \text{ (gf)}$$

Also, while the notched wafers 60 are received in the cassette 70, the wafers 60 are respectively kept leaning against partition ribs 72 of the cassette 70, resulting in being inclined in either a left-hand direction or a right-hand direction at angle θ with respect to a vertical direction while side portions 64 of the wafers 60 positioned on the respective horizontal center lines thereof are respectively in contact with portions of the partition ribs 72 as shown in FIGS. 3 and 4. Thus, during rotation of the notch detection rollers 12 while keeping the notched wafers 60 carried on the notch detection rollers 12, the notched wafers 60 are each applied thereto by frictional force at a contact point (64) between the cassette 70 and the wafer 60 as shown in FIGS. 3 and 4. The frictional force $F_3$ is calculated according to the following expression (3):

$$F_3 = W \cdot \tan \theta \cdot \mu_3 \qquad (3)$$

wherein W is a load or weight of the wafer 60, tan θ is determined from an outer diameter $D_W$ of the wafer 60 and a clearance C between the wafer 60 and the adjacent two partition ribs 72 which hold the wafer 60 in association with each other and $\mu_3$ is a friction coefficient between the cassette 70 and the wafers 60, which is supposed to be 0.1. Set W=80 gf, $D_W$=200 mm, C=3 mm, $\mu_3$=0.1: then $$F_3 = 80 \times 3/(200/2) \times 0.1 = 0.24 \text{ (gf)}$$

Figure 5:
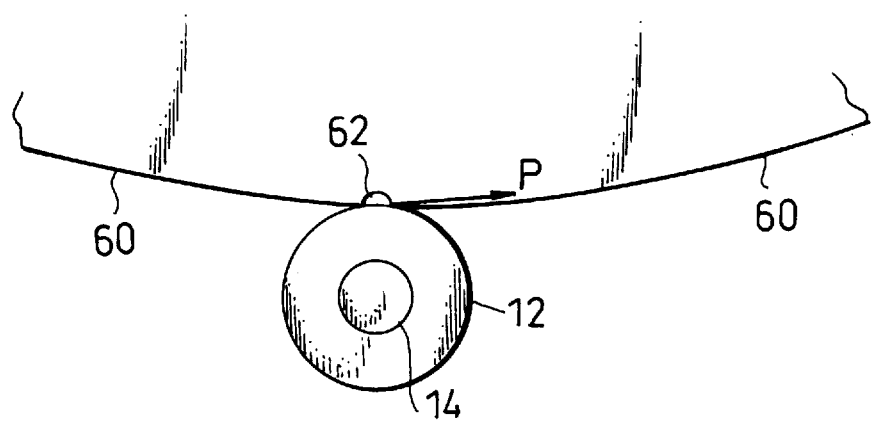
FIG. 5 is a fragmentary enlarged front elevation view showing aligning of wafers by the notched wafer aligning apparatus shown in FIG. 1.

Thus, the resistive forces $F_2$ and $F_3$ are exerted with respect to rotation of the notched wafers 60. In this instance, $F_1$ is larger than the sum of $F_2$ and $F_3$ ($F_1 > F_2 + F_3$), so that the individual notch detection rollers 12 are synchronously rotated without being slipped on the rotation drive shaft 14. Rotation of the notch detection rollers 12 permits rotation of the notched wafers 60 to be continued, so that the notches 62 of the wafers 60 are moved to a position contiguous to the notch detection rollers 12. Then, when the notch 62 of one of the wafers 60 is brought into contact with a corresponding one of the notch detection rollers 12, that is, the notch 62 is moved to a position at which the notch 62 straddles the notch detection roller 12 corresponding thereto, force P calculated according to the following expression (4) is required in order that the notch detection roller 12 further rotate the wafer 60, as shown in FIG. 5:

$$P \approx [(B/2)/(D_1/2)] \times W \qquad (4)$$

wherein W is a load or weight of the wafer 60, B is a width of the notch 62 and $D_1$ is an outer diameter of the notch detection rollers 12. Set B=2.8 mm, $D_1$=15 mm, W=80 gf: then $$P \approx (1.4/7.5) \times 80 = 14.9 \text{ (gf)}$$

As noted from the numeral values calculated according to the expressions (1) and (4), P is larger than $F_1$ ($P > F_1$), so that each notch detection roller 12 is caused to be slipped with respect to the rotation drive shaft 14, that is, only the rotation drive shaft 14 is rotated while keeping the notch detection rollers 12 stationary, resulting in all the wafers 60 (of twenty-five to twenty-six in number) are stopped from being rotated when the notches 62 are moved to a position on the notch detection rollers 12. This permits the wafers 60 to be accurately orientated or aligned with each other in the same direction.

Then, the notched wafers 60 are moved to a predetermined position by means of the top alignment roller 30 while keeping the notches 62 thus orientated or aligned. More specifically, the notched wafers 60 are rotated by the notch detection rollers 12, to thereby permit the notches 62 of the wafers 60 to be aligned with each other in the same direction, and then the top alignment roller 30 positioned below the notch detection rollers 12 and guide rollers 26 is raised by the second cylinder 38, to thereby be abutted against the lower portion of the peripheral edges of the wafers 60, resulting in the wafers 60 being lifted as shown in FIG. 6.

Then, the top alignment roller 30 is stopped at the upper end of the vertical stroke after it is upwardly moved to separate the notched wafers 60 from the notch detection rollers 12. Subsequently, the top alignment roller 30 is applied thereto drive force from the second drive motor 32 through the second wrapping transmission mechanism including the second belt 34 and second pulley 36, to thereby be rotated, leading to rotation of the notched wafers 60. Such rotation of the notched wafers 60 for a predetermined period of time permits all the wafers 60 to be moved to any desired position while keeping the notches 62 aligned with each other in the same direction.

As described above, the illustrated embodiment is so constructed that the notch detection rollers 12 equal in number to the notched wafers 60 or more are arranged on the rotation drive shaft 14 in a manner to be juxtaposed to each other and loosely fitted on the rotation drive shaft 14 in a manner to be rotatable with respect to the shaft 14, resulting in a friction coefficient of a suitable level being exhibited between the notch detection rollers 12 and the rotation drive shaft 14. Such construction ensures that the force $F_1$ in the direction of rotation of the wafers 60 exhibits a magnitude sufficient to rotate each of the wafers 60 at a portion thereof at which the notch 62 is not provided and is decreased to a level smaller than the force P required for further moving or transferring the notch 62 of each of the wafers 60 when the notch 62 is moved to a position where the notch 62 straddles the notch detection roller 12 as shown in FIG. 5.

Also, the notch detection rollers 12 are preferably disposed at a position deviated or displaced by a small distance from a reference line or vertical line extending through a center of a circle of the wafers 60 in order to facilitate rotation of the wafers 60 in a predetermined direction. This permits the notches 62 of a number of the wafers 60 received in disorder with respect to each other in the cassette 70 to be accurately aligned with each other on the notch detection rollers 12. Further, the guide rollers 26 may be replaced with a structure for pressing each of the wafers 60 against one end of a corresponding one of wafer grooves of the cassette 70. Alternatively, any other suitable guide members may be substituted for the guide rollers 26 to individually guide rotation of the notched wafers 60 while exhibiting resistive force with respect to the wafers 60, resulting in facilitating adjustment of turning force of the notch detection rollers 12.

Further, the top alignment roller 30, as noted from the above, functions to move or transfer the notches 62 of the notched wafers 60 aligned once to any desired position such as an upper position in a lump. This permits the notched wafers 60 to be readily conformed to various specifications therefor.

Now, the manner of operation of the notched wafer aligning apparatus of the illustrated embodiment thus constructed will be described hereinafter.

First, the notch detection rollers 12 and guide rollers 26 are raised toward a number of the notched wafers 60 received in the cassette 70 placed on the base 10 due to upward movement of the mounting base 22. This permits the notch detection rollers 12 and guide rollers 26 to be introduced through a lower open end of the cassette 70 into the cassette 70, to thereby be brought into contact with the lower portion of the peripheral edges of the notched wafers 60 in the cassette 70. This results in the notch detection rollers 12 pushing up or upwardly urging the wafers 60 and then upward movement of the rollers 12 being stopped at the upper end of the vertical stroke thereof. At this time, the notch detection rollers 12 and guide rollers 26 are so located that a center of the notch detection rollers 12 is at a position somewhat deviated from the vertical center line of the notched wafers 60 in the cassette 70 and a center of the guide rollers 26 is positioned apart from the center of the notch detection rollers 12 with the vertical center line of the wafers 60 being interposed between the notch detection rollers 12 and the guide rollers 26.

Then, the first drive motor 16 is driven to rotate the rotation drive shaft 14 through the first belt 18 and first pulley 20, so that the notch detection rollers 12 may be individually rotated in synchronism with rotation of the rotation drive shaft 14 due to friction between the notch detection rollers 12 and the rotation drive shaft 14 while having the notched wafers 60 carried thereon.

Continuous rotation of the notched wafers 60 due to rotation of the notch detection rollers 12 leads to movement of the notches 62 of the wafers 60 to a position which permits the notches 62 to be brought into contact with the notch detection rollers 12 while rotating the notches 62. Then, when the notches 62 are respectively brought into contact with the notch detection rollers 12, to thereby straddle the rollers 12, a resistance between each wafer 60 and a corresponding one of the rollers 12 is increased to a level sufficient to cause force required for rotating the wafer 60 to be excessively increased, so that rotation of each of the notch detection rollers 12 is stopped due to slippage of the roller 12 on the rotation drive shaft 14. As a result, only the rotation drive shaft 14 continues to be rotated. Thus, all the notched wafers 60 are kept from being rotated when the notches 62 of the wafers 60 are moved to a position on the notch detection rollers 12, resulting in being accurately aligned with each other at the same position and in the same direction.

Figure 8A:
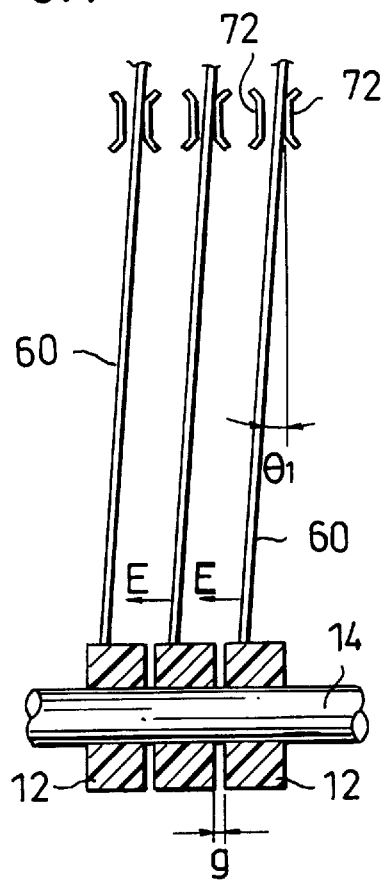
FIGS. 8A and 8B each are a schematic view showing sliding of notch detection rollers and guide rollers.
Figure 8B:
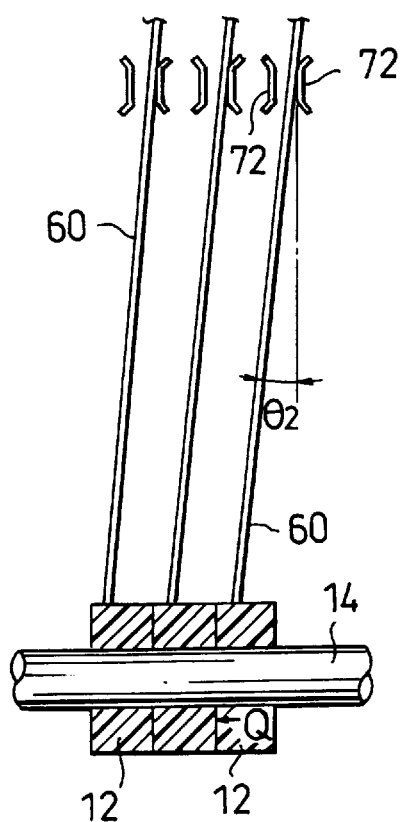

The above description has been made on the assumption that the notch detection rollers 12 and guide rollers 26 are not affected by the rollers adjacent thereto, respectively. Indeed, the wafers 60 respectively rest on the notch detection rollers 12 and guide rollers 26 while being inclined at a small angle $\theta_1$ with respect to the rollers 12 and 26 as shown in FIG. 8A. Such an inclined posture of the wafer 60 produces force Q in an axial direction (FIG. 8B) to be applied to the notch detection roller 12 and guide roller 26, resulting in the notch detection rollers 12 adjacent to each other and guide rollers 26 adjacent to each other being slid in the axial direction during rotation thereof, to thereby be in contact with each other as shown in FIG. 8B, irrespective of the fact that the notch detection rollers 12 and guide rollers 26 are loosely fitted on the rotation drive shaft 14 and the support shaft 28 so as to be spaced from each other at intervals g, respectively, as shown in FIG. 8A.

The above-described sliding movement of the notch detection rollers 12 and guide rollers 26 in the axial direction is caused by vibration of the rotation drive shaft 14, as well as by marks or traces of working or machining of the rotation drive shaft 14 and/or by a component E of force due to inclination of each of the wafers 60 as shown in FIGS. 8A to 9C. More particularly, the rotation drive shaft 14 is generally made by machining with a lathe, during machining fine spiral traces due to the machining are formed and left on a peripheral surface of the shaft 14, to thereby cause the greater part 12a of the notch detection rollers 12 to be fed or moved in the axial direction. If one of the wafers 60 is supported by a corresponding one of the notch detection rollers 12 in a manner to be inclined, the above-described inclination of the notched wafer 60 at a small angle $\theta_1$ causes generation of the force component E. The force component E thus generated is of a very small magnitude, however, it is not negligible when all or most of the wafers 60 supported on the notch detection rollers 12 are inclined in the same direction. For example, supposing that twenty such notched wafers 60 are inclinedly supported on the greater part 12a of the notch detection rollers 12, the total of the force components E is increased by a factor of twenty, to thereby cause the greater part 12a of the notch detection rollers 12 to be slid in the axial direction.

Figure 9A:
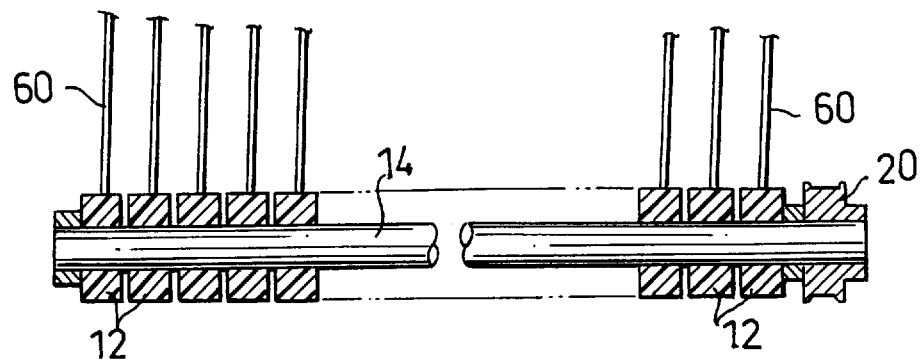
Figure 9B:
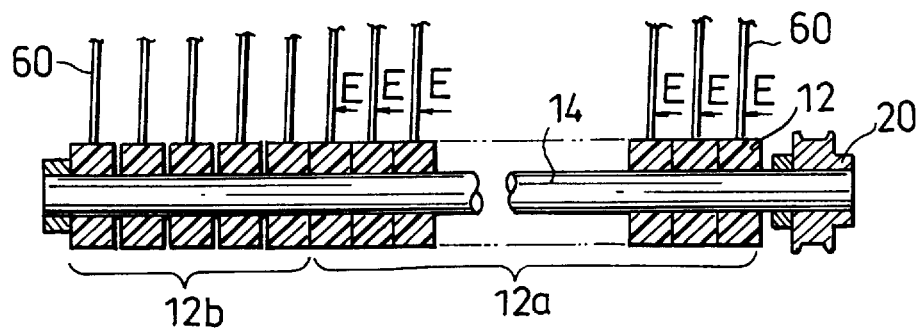
Figure 9C:
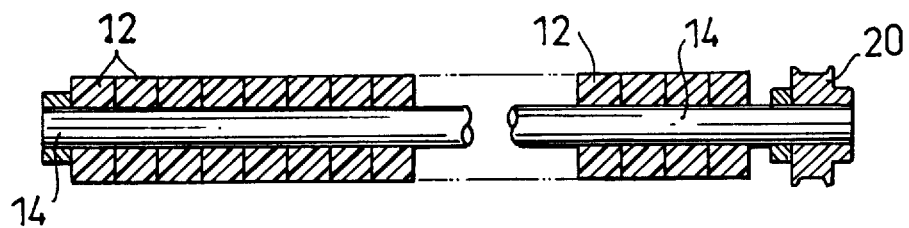

Such sliding of the greater part 12a of the notch detection rollers 12 in the axial direction causes pressing force exerted on a small part 12b of the notch detection rollers 12 to be increased, leading to an increase in frictional force between notch detection rollers 12 constituting the small part 12b of the notch detection rollers 12, so that the pressing force or frictional force erroneously forcibly stop rotation of the small part 12b of the notch detection rollers 12 of which the notches 62 are not yet aligned with each other, as shown in FIG. 9C. Also, the inclination angle $\theta_1$ is increased to a magnitude of $\theta_2$ as shown in FIG. 8B with sliding of the greater part 12a of the notch detection rollers 12, so that pressing force exerted on the small part 12b of the notch detection rollers is further increased. In order to eliminate such a problem, it would be considered that an outer peripheral surface of each of the notch detection rollers 12 and guide rollers 26 is made of a material highly decreased in friction coefficient. However, actually, selection of such material is substantially impossible. Even if it is possible, it may possibly cause an increase in cost.

Figure 10A:
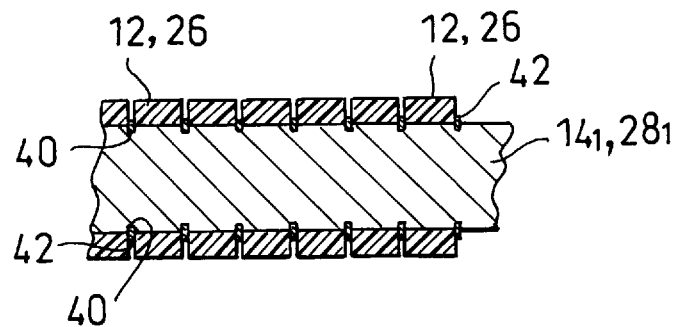
FIG. 10A is a fragmentary enlarged view showing an essential part of a second embodiment of a notched wafer aligning apparatus according to the present invention, wherein notch detection rollers and guide rollers are respectively fitted on a rotation drive shaft and a support shaft.

Referring to FIG. 10A, an essential part of a second embodiment of a notched wafer aligning apparatus is illustrated. In the illustrated embodiment, the rotation drive shaft $14_1$ and support shaft $28_1$, as shown in FIG. 1A, are each formed on a peripheral surface thereof with a plurality of annular grooves 40 in a manner to be spaced from each other at intervals. Then, the notch detection rollers 12 and guide rollers 26 are fitted on the rotation drive shaft $14_1$ and support shaft $28_1$ while a retaining ring 42 is fitted in each of the annular grooves 40 in a manner to be interposed between each adjacent two of the rollers 12 and 26, respectively. Such construction effectively prevents the notch detection rollers 12 and guide rollers 26 from being brought into contact with each other, respectively. Also, the pressing force and frictional force described above are exerted on only the retaining rings 42, so that the notch detection rollers 12 and guide rollers 26 operate independently from each other, respectively. This positively prevents the notches 62 of any part of the wafers 60 from being arranged in disorder, resulting in the notched wafer aligning apparatus of the illustrated embodiment exhibiting highly increased reliability while being simplified in structure. The remaining part of this embodiment may be constructed in substantially the same manner as the first embodiment described above.

Figure 10B:
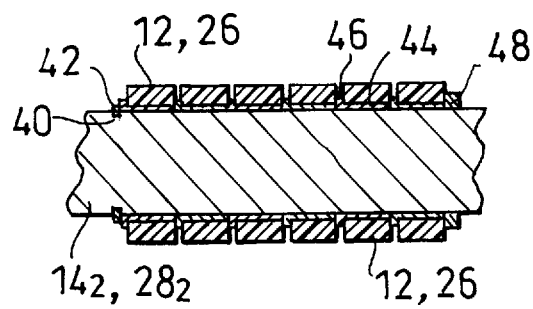
FIG. 10B is a view similar to FIG. 10A showing an essential part of a third embodiment of a notched wafer aligning apparatus according to the present invention.

Referring now to FIG. 10B, an essential part of a third embodiment of a notched wafer aligning apparatus according to the present invention is illustrated. In a notched wafer aligning apparatus of the third embodiment, notch detection rollers 12 and guide rollers 28 are rotatably fitted on a rotation drive shaft $14_2$ and a support shaft $28_2$ through respective collars 44. The collars 44 which are made of stainless steel exhibiting reduced friction coefficients for the notch detection rollers 12 and guide rollers 26 and are each equipped with a flange 46 at one end thereof are fitted on the rotation drive shaft $14_2$ and support shaft $28_2$ in order, respectively. Then, retaining rings 42 and pressing rings 48 made of stainless steel are fitted on the rotation drive shaft $14_2$ and support shaft $28_2$, to thereby securely fix the flange-equipped collars 44 onto the rotation drive shaft $14_2$ and support shaft $28_2$, respectively. The remaining part of this this embodiment may be constructed in substantially the same manner as the second embodiment described above.

Thus, in the notched wafer aligning apparatus of the illustrated embodiment, the collars 44 each equipped with the flange 46 are arranged while the flanges 46 thereof are interposed between the adjacent notch detection rollers 12 and between the adjacent guide rollers 26 to prevent contact between the notch detection rollers 12 and between the guide rollers 26, respectively. Also, such pressing force and frictional force as described above are exerted on only the flange-equipped collars 44, to thereby ensure that the notch detection rollers 12 and guide rollers 26 are operated independently from each other without interfering with each other, respectively. Such construction effectively prevents the notches 62 of a part of the wafers 60 from being arranged in disorder or misaligned while being simplified in structure, so that the notched wafer aligning apparatus of the illustrated embodiment may exhibit highly increased reliability while increasing yields of products.

Figure 10C:
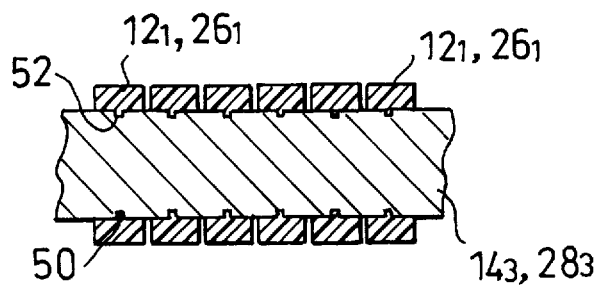
FIG. 10C is a view similar to FIG. 10A showing an essential part of a fourth embodiment of a notched wafer aligning apparatus according to the present invention.

Referring now to FIG. 10C, an essential part of a fourth embodiment of a notched wafer aligning apparatus according to the present invention is illustrated. In a notched wafer aligning apparatus of the fourth embodiment, a rotation drive shaft $14_3$ and a support shaft $28_3$ are each formed on a peripheral surface thereof with a plurality of recessed grooves 50 in a manner to be spaced from each other at intervals. Also, a plurality of notch detection rollers $12_1$ and a plurality of guide rollers $26_1$ are each formed on an inner peripheral surface thereof with an annular projection 52. The projections 52 of the notch detection rollers $12_1$ and those of the guide rollers $26_1$ are fitted in the grooves 50 of the rotation drive shaft $14_3$ and those of the support shaft $28_3$ by a method similar to shrink fit, respectively. This results in the notch detection rollers $12_1$ or guide rollers $26_1$ being independent from each other through gaps which are defined between the adjacent two of the rollers $12_1$ or $26_1$, respectively. The remaining part of the fourth embodiment may be constructed in substantially the same manner as the second or third embodiment described above. Thus, it will be noted that the fourth embodiment exhibits substantially the same function and advantage as the second or third embodiment described above.

In the fourth embodiment thus constructed, the rotation drive shaft $14_3$ and support shaft $28_3$ are each formed thereon with the grooves 50 and the notch detection rollers $12_1$ and guide rollers $26_1$ are each formed with the projection 52. However, the fourth embodiment is not limited to such construction. It may be so constructed that projections are provided on each of a rotation drive shaft and a support shaft and a recessed groove is provided on each of notch detection rollers and guide rollers.

As can be seen from the foregoing, the notched wafer aligning apparatus of the present invention permits a plurality of the notch detection rollers for rotating a plurality of notched wafers to be rotationally driven by means of a single drive source and permits the notched wafers to be accurately aligned with each other while keeping any excessive load from being applied to the wafers. Also, the notched wafers are supportedly placed on the notch detection rollers, respectively; so that when the notches of the notched wafers abut against the notch detection rollers by means of frictional force between the notch detection rollers and the rotation drive shaft, slippage occurs between the rollers and the rotation drive shaft, resulting in the notches of all the wafers received in the cassette being accurately aligned with each other. This permits the notched wafers to be orientated in the same direction with increased efficiency.

Also, the notched wafer aligning apparatus of the present invention permits the notched wafers received in disorder in the cassette to be readily aligned with each other at a predetermined position and facilitates shifting of the notched wafers to any desired position in the cassette. Further, it ensures orientation and alignment of the wafers with increased reliability while preventing an increase in particles and static electricity in the cassette and minimizing generation of any positional error. Furthermore, it minimizes adjustment in the wafer aligning operation to substantially improve workability while being simplified in structure and reduced in cost. In addition, it effectively prevents misalignment of notches of notched wafers due to sliding of the notch detection rollers in the axial direction, to thereby further increase reliability in operation.

While preferred embodiments of the invention have been described with reference to the accompanying drawings, obvious modifications and variations are possible in light of the above teachings. It is therefore to be understood that within the scope of the appended claims, the invention may be practiced otherwise than as specifically described.

What is claimed is:

1. A notched wafer aligning apparatus for aligning a plurality of notched wafers arranged in juxtaposition to each other in a cassette with each other, comprising:

a plurality of notch detection rollers rotatably arranged so as to be rotationally driven while being respectively abutted against peripheral edges of the notched wafers to orientate notches of the wafers in the same direction;

said notch detection rollers being rotatably mounted on a rotation drive shaft in juxtaposition to each other while being arranged in correspondence to the notched wafers and at a position deviated by a predetermined distance from a vertical center line of the notched wafers;

said notch detection rollers being individually rotated on said rotation drive shaft by frictional force between said notch detection rollers and said rotation drive shaft to move the notched wafers in the cassette, to thereby orientate the notched wafers in the same direction.

2. A notched wafer aligning apparatus as defined in claim 1, wherein said rotation drive shaft for said notch detection rollers is supported on a vertically movable mounting base;

said mounting base is mounted thereon with a first drive motor, said first drive motor being operatively connected to said rotation drive shaft; and said mounting base is mounted to a first lifting mechanism so as to be vertically moved by said first lifting mechanism, whereby said notch detection rollers are brought into and out of contact with the peripheral edges of the notched wafers while being vertically moved through said mounting base.

3. A notched wafer aligning apparatus as defined in claim 2, wherein said first lifting mechanism includes a first cylinder; and said first drive motor is operatively connected to said rotation drive shaft through a first wrapping transmission mechanism which includes a first pulley mounted on said rotation drive shaft and a first belt operatively connected between said first drive motor and said first pulley.

4. A notched wafer aligning apparatus as defined in claim 1, further comprising guide rollers arranged at a position spaced by a predetermined distance from said notch detection rollers in a direction of rotation of the notched wafers rotated by said notch detection rollers to guide rotation of the notched wafers while being engaged with the respective peripheral edges of the notched wafers.

5. A notched wafer aligning apparatus as defined in claim 2, further comprising guide rollers arranged at a position spaced by a predetermined distance from said notch detection rollers in a direction of rotation of the notched wafers rotated by said notch detection rollers to guide rotation of the notched wafers while being engaged with the respective peripheral edges of the notched wafers.

6. A notched wafer aligning apparatus as defined in claim 4, wherein said guide rollers are each rotatably mounted on a fixed support shaft so as to individually follow rotation of the rotated wafers.

7. A notched wafer aligning apparatus as defined in claim 5, wherein said guide rollers are each rotatably mounted on a fixed support shaft so as to individually follow rotation of the rotated wafers.

8. A notched wafer aligning apparatus as defined in claim 7, wherein said support shaft for said guide rollers is supported on said mounting base so that said guide rollers are brought into and out of contact with the peripheral edges of the notched wafers while being vertically moved through said mounting base.

9. A notched wafer aligning apparatus as defined in claim 1, further comprising an additional alignment roller vertically movably arranged for separating and transferring, from said notch detection rollers, the notched wafers aligned with each other by said notch detection rollers.

10. A notched wafer aligning apparatus as defined in claim 4, further comprising an additional alignment roller vertically movably arranged for separating and transferring, from said notch detection rollers, the notched wafers aligned with each other by said notch detection rollers.

11. A notched wafer aligning apparatus as defined in claim 6, further comprising an additional alignment roller vertically movably arranged for separating and transferring, from said notch detection rollers, the notched wafers aligned with each other by said notch detection rollers.

12. A notched wafer aligning apparatus as defined in claim 8, further comprising an additional alignment roller vertically movably arranged for separating and transferring, from said notch detection rollers, the notched wafers aligned with each other by said notch detection rollers.

13. A notched wafer aligning apparatus as defined in claim 9, wherein said additional alignment roller is rotationally driven by a second drive motor through a second wrapping transmission mechanism including a second pulley mounted on said additional alignment roller and a second belt operatively connected between said second drive motor and said second pulley; and said additional alignment roller is vertically moved through a second lift mechanism including a second cylinder, resulting in said additional alignment roller being lifted to separate the notched wafers aligned by said notch detection rollers from said notch detection rollers and rotated to transfer the notched wafers to a predetermined position.

14. A notched wafer aligning apparatus as defined in claim 10, wherein said additional alignment roller is rotationally driven by a second drive motor through a second wrapping transmission mechanism including a second pulley mounted on said additional alignment roller and a second belt operatively connected between said second drive motor and said second pulley; and said additional alignment roller is vertically moved through a second lift mechanism including a second cylinder, resulting in said additional alignment roller being lifted to separate the notched wafers aligned by said notch detection rollers from said notch detection rollers and rotated to transfer the notched wafers to a predetermined position.

15. A notched wafer aligning apparatus as defined in claim 11, wherein said additional alignment roller is rotationally driven by a second drive motor through a second wrapping transmission mechanism including a second pulley mounted on said additional alignment roller and a second belt operatively connected between said second drive motor and said second pulley; and said additional alignment roller is vertically moved through a second lift mechanism including a second cylinder, resulting in said additional alignment roller being lifted to separate the notched wafers aligned by said notch detection rollers from said notch detection rollers and rotated to transfer the notched wafers to a predetermined position.

16. A notched wafer aligning apparatus as defined in claim 1, wherein said notch detection rollers are fitted on said rotation drive shaft at intervals and a first retaining ring is interposed between each adjacent two of said notch detection rollers, said first retaining rings being respectively fitted in annular grooves formed on said rotation drive shaft.

17. A notched wafer aligning apparatus as defined in claim 4, wherein said notch detection rollers are fitted on said rotation drive shaft at intervals and a first retaining ring is interposed between each adjacent two of said notch detection rollers, said first retaining rings being respectively fitted in annular grooves formed on said rotation drive shaft.

18. A notched wafer aligning apparatus as defined in claim 9, wherein said notch detection rollers are fitted on said rotation drive shaft at intervals and a first retaining ring is interposed between each adjacent two of said notch detection rollers, said first retaining rings being respectively fitted in annular grooves formed on said rotation drive shaft.

19. A notched wafer aligning apparatus as defined in claim 1, wherein said notch detection rollers are fitted on said rotation drive shaft through respective first single-flanged collars securely fitted on said rotation drive shaft.

20. A notched wafer aligning apparatus as defined in claim 4, wherein said notch detection rollers are fitted on said rotation drive shaft through respective first single-flanged collars securely fitted on said rotation drive shaft.

21. A notched wafer aligning apparatus as defined in claim 9, wherein said notch detection rollers are fitted on said rotation drive shaft through respective first single-flanged collars securely fitted on said rotation drive shaft.

22. A notched wafer aligning apparatus as defined in claim 1, wherein said notch detection rollers are each formed on an inner peripheral surface thereof with an annular projection;
   said rotation drive shaft is formed thereon with annular grooves in each of which said annular projection of a corresponding one of said notch detection rollers is received; and
   said notch detection rollers are arranged on said rotation drive shaft so that a gap is defined between each adjacent two of said notch detection rollers.

23. A notched wafer aligning apparatus as defined in claim 4, wherein said notch detection rollers are each formed on an inner peripheral surface thereof with an annular projection;
   said rotation drive shaft is formed thereon with annular grooves in each of which said annular projection of a corresponding one of said notch detection rollers is received; and
   said notch detection rollers are arranged on said rotation drive shaft so that a gap is defined between each adjacent two of said notch detection rollers.

24. A notched wafer aligning apparatus as defined in claim 9, wherein said notch detection rollers are each formed on an inner peripheral surface thereof with an annular projection;
   said rotation drive shaft is formed thereon with annular grooves in each of which said annular projection of a corresponding one of said notch detection rollers is received; and
   said notch detection rollers are arranged on said rotation drive shaft so that a gap is defined between each adjacent two of said notch detection rollers.

25. A notched wafer aligning apparatus as defined in claim 6, wherein said guide rollers are fitted on said support shaft at intervals and a retaining ring is interposed between each adjacent two of said guide rollers, said retaining rings being respectively fitted in annular grooves formed on said support shaft.

26. A notched wafer aligning apparatus as defined in claim 11, wherein said guide rollers are fitted on said support shaft at intervals and a retaining ring is interposed between each adjacent two of said guide rollers, said retaining rings being respectively fitted in annular grooves formed on said support shaft.

27. A notched wafer aligning apparatus as defined in claim 15, wherein said guide rollers are fitted on said support shaft at intervals and a retaining ring is interposed between each adjacent two of said guide rollers, said retaining rings being respectively fitted in annular grooves formed on said support shaft.

28. A notched wafer aligning apparatus as defined in claim 6, wherein said guide rollers are fitted on said support shaft through respective single-flanged collars securely fitted on said support shaft.

29. A notched wafer aligning apparatus as defined in claim 11, wherein said guide rollers are fitted on said support shaft through respective single-flanged collars securely fitted on said support shaft.

30. A notched wafer aligning apparatus as defined in claim 15, wherein said guide rollers are fitted on said support shaft through respective single-flanged collars securely fitted on said support shaft.

31. A notched wafer aligning apparatus as defined in claims 6, wherein said guide rollers are each formed on an inner peripheral surface thereof with an annular projection;
   said support shaft is formed thereon with annular grooves in each of which said annular projection of a corresponding one of said guide rollers is received; and
   said guide rollers are arranged on said support shaft so that a gap is defined between each adjacent two of said guide rollers.

32. A notched wafer aligning apparatus as defined in claims 11, wherein said guide rollers are each formed on an inner peripheral surface thereof with an annular projection;
   said support shaft is formed thereon with annular grooves in each of which said annular projection of a corresponding one of said guide rollers is received; and
   said guide rollers are arranged on said support shaft so that a gap is defined between each adjacent two of said guide rollers.

33. A notched wafer aligning apparatus as defined in claims 15, wherein said guide rollers are each formed on an inner peripheral surface thereof with an annular projection;
   said support shaft is formed thereon with annular grooves in each of which said annular projection of a corresponding one of said guide rollers is received; and
   said guide rollers are arranged on said support shaft so that a gap is defined between each adjacent two of said guide rollers.

* * * * *